United States Patent [19]

Skudera, Jr.

[11] Patent Number: 5,469,173
[45] Date of Patent: Nov. 21, 1995

[54] MONITORING PHASE CHARACTERISTICS OF BPSK AND CW SIGNALS

[75] Inventor: William J. Skudera, Jr., Oceanport, N.J.

[73] Assignee: The United States of America as represented by the Secretary of the Army, Washington, D.C.

[21] Appl. No.: 224,606

[22] Filed: Apr. 7, 1994

[51] Int. Cl.[6] ....................................................... G01S 7/28
[52] U.S. Cl. ........................ 342/202; 342/195; 342/132; 342/134; 342/102
[58] Field of Search .................................... 342/201, 202, 342/203, 204, 195, 102, 132, 134

[56] References Cited

U.S. PATENT DOCUMENTS 4,443,801  4/1984  Klose et al. ............................ 342/442
5,257,284 10/1993  Skudera, Jr. et al. ...................... 375/1

*Primary Examiner*—John B. Sotomayor
*Attorney, Agent, or Firm*—Michael Zelenka; John M. O'Meara

[57] ABSTRACT

Discernible frequency characteristics regarding BPSK and CW signals are derived from consecutive transform outputs of a dual channel chirp-Z processor. Physically separated antennas direct the signals to the chirp-Z channels and concurrently occurring transforms are directed from those channels to a particular phase detector in accordance with the type of signal to which such transforms relate. The selection of phase detector is made through switches which are controlled by logic circuitry in accordance with the discernible frequency characteristics.

7 Claims, 3 Drawing Sheets

FIG. 2 *PRIOR ART*

MONITORING PHASE CHARACTERISTICS OF BPSK AND CW SIGNALS

GOVERNMENT INTEREST

The invention described herein may be manufactured, used, and licensed by or for the United States Government for governmental purposes without payment to me of any royalties thereon.

BACKGROUND OF THE INVENTION

The present invention relates to the field of COMINT/ELINT (Communications Intelligence/Electronic Intelligence) signal processing, and more particularly to the discernment of transforms derived from a dual-channel chirp-Z processor regarding BPSK (binary phase shift keying) and CW (continuous wave) signals, when monitoring the phase characteristics of such signals.

One system of background interest is disclosed in U.S. Pat. No. 4,443,801 entitled, DIRECTION FINDING AND FREQUENCY IDENTIFICATION METHOD AND APPARATUS by D. Klose and W. Skudera, Jr. dated Apr. 17, 1984 ("the '801 patent"). This patent describes a system that accurately monitors phase characteristics regarding only CW signals which are intercepted by physically separated antennas that input individually to a dual channel chirp-Z processor.

Another system of background interest is disclosed in U.S. Pat. No. 5,257,284 entitled CIRCUIT FOR ACCURATELY MEASURING PHASE RELATIONSHIP OF BPSK SIGNALS by William J. Skudera, Jr. and Vasilios Alevizakos dated Oct. 26, 1993 ("the '284 patent"). This patent describes a system that accurately monitors phase characteristics regarding only BPSK signals which are intercepted by physically separated antennas that input individually to a dual channel chirp-Z processor.

The '801 and '284 Patents are expressly incorporated herein by reference.

SUMMARY OF THE INVENTION

It is the general object of the present invention to provide a circuit for contemporaneously monitoring phase characteristics of CW and BPSK signals.

It is a specific object of the present invention to discriminate between chirp-Z transforms of CW and BPSK signals when accomplishing the above-stated general object.

These and other objects are accomplished in accordance with the present invention by directing the chirp-Z transforms of CW and BPSK signals to separate phase detectors. The transforms from both channels of a dual channel chirp-Z processor are applied to the phase detectors, through separate switches. Sequencing of the switches is controlled in accordance with the amplitude characteristics of the transforms. Such characteristics are detected through a pair of comparators and an exclusive OR gate which are combined with time delays to preclude sequencing overlap.

The scope of the present invention is only limited by the appended claims for which support is predicated on the preferred embodiments hereinafter set forth in the following description and the attached drawings.

DESCRIPTION OF THE PREFERRED EMBODIMENTS

Figure 1:
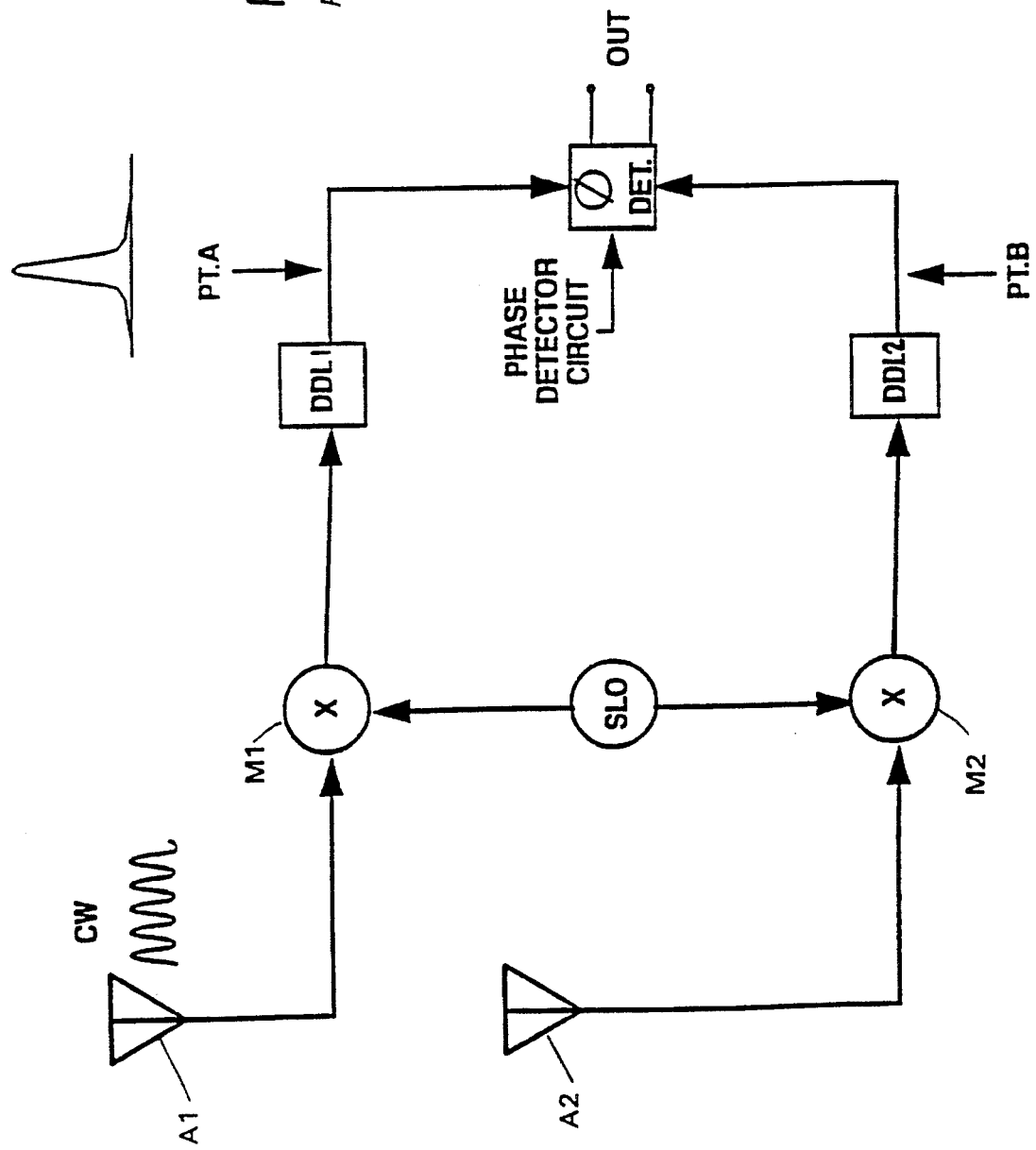
FIG. 1 is a block diagram of the system disclosed in the '801 patent.

In the system of the '801 patent to which the block diagram of FIG. 1 applies, two physically separated antennas A1 and A2 continually intercept signals and are individually connected to the channels of a dual chirp-Z processor. Within this processor, the antenna signals are combined in multipliers M1 and M2 with the output from a sweeping local oscillator SLO. This SLO is conventionally driven by an expander (not shown) that generates a series of ramp signals in response to a series of impulse signals which are derived from a pulse generator. The outputs from M1 and M2 are passed through dispersive delay lines DDL1 and DDL2 respectively, which output chirp-Z transforms at points A and B. These transforms are applied to a detector circuit which outputs the desired phase characteristics of the antenna signals. However, the circuit of FIG. 1 is only effective for CW signals.

Figure 2:
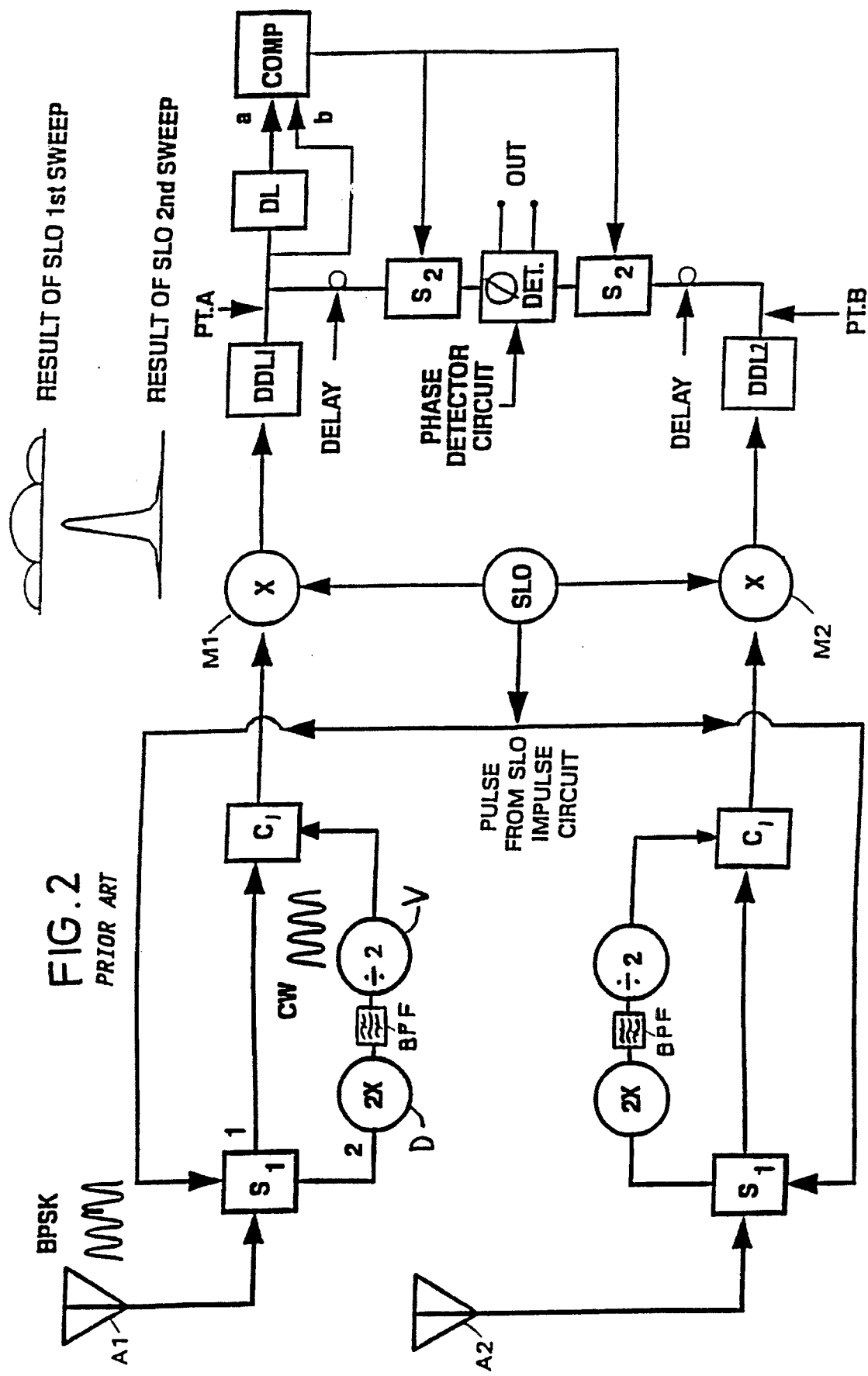
FIG. 2 is a block diagram of the system disclosed in the '284 patent.

The block diagram of FIG. 2 relates to the system of the '284 patent and the circuitry thereof is only effective for BPSK signals. As in FIG. 1, signals from physically separated antennas are each inputed to only one channel of a dual chirp-Z processor. In FIG. 2 however, each antenna is connected to its chirp-Z channel by a circuit for passing signals therefrom through either a first or second path. Each first path passes antenna signals directly to the chirp-Z channel, while each second path passes antenna signals to the chirp-Z channel through means for deriving the fundamental CW frequency of BPSK and CW signals. In each such circuit, a switch S1 applies the antenna signals to either the first or second path. Both paths pass antenna signals to a multiplier M1 or M2 through a coupler C1. Consequently, the chirp-Z transforms which appear at point "A" relative to CW signals passing thereto through the first path have narrow pulse widths, while such transforms relative to BPSK signals have wide pulse widths. In both second paths, the fundamental frequency deriving means includes a frequency doubler D, a bandpass filter BPF and a frequency divider. For antenna signals passing through either second path therefore, any phase modulation is stripped therefrom and only the fundamental CW frequency results, as discussed in the '284 patent. Consequently, the chirp-Z transforms which appear at point "A" relative to CW and BPSK signals passing thereto through the second path have only narrow pulse widths. Switches S1 are controlled by the impulse signals of the pulse generator associated with the SLO in the chirp-Z processor and alternately direct signals from the antennas to the first and second paths during successive sweeps of the SLO.

Chirp-Z transforms relating to only BPSK signals are applied to the phase detector circuit in the block diagram of FIG. 2. This is accomplished with toggle switches S2 through which the chirp-Z transforms at points "A" and "B" are passed to the phase detector. As is well known in the art, a toggle switch must be activated both on and off. Switches S2 are controlled with the output of a comparator COMP which has the transform output from only one chirp-Z channel applied to both inputs thereof. One input receives the chirp-Z transform directly, while the other input receives the transform through a time delay DL, equal in magnitude to the SLO sweep duration. The COMP outputs a voltage level to toggle switches S2 whenever the "a" and "b" inputs thereof are at different voltage levels. As explained in the '284 patent, this output voltage level occurs whenever successive sweeps of the SLO result in chirp-Z transforms having wide and narrow or narrow and wide pulse widths. Of course, those skilled in the electronic arts realize that such a comparator is readily available on integrated circuit chips having operational amplifiers which need only be biased as specified by the chip manufacturer. Otherwise, the toggle sequence is prearranged to only turn the switches S2 on when the chirp-Z transforms at points "A" and "B" have narrow pulse widths.

Figure 3:
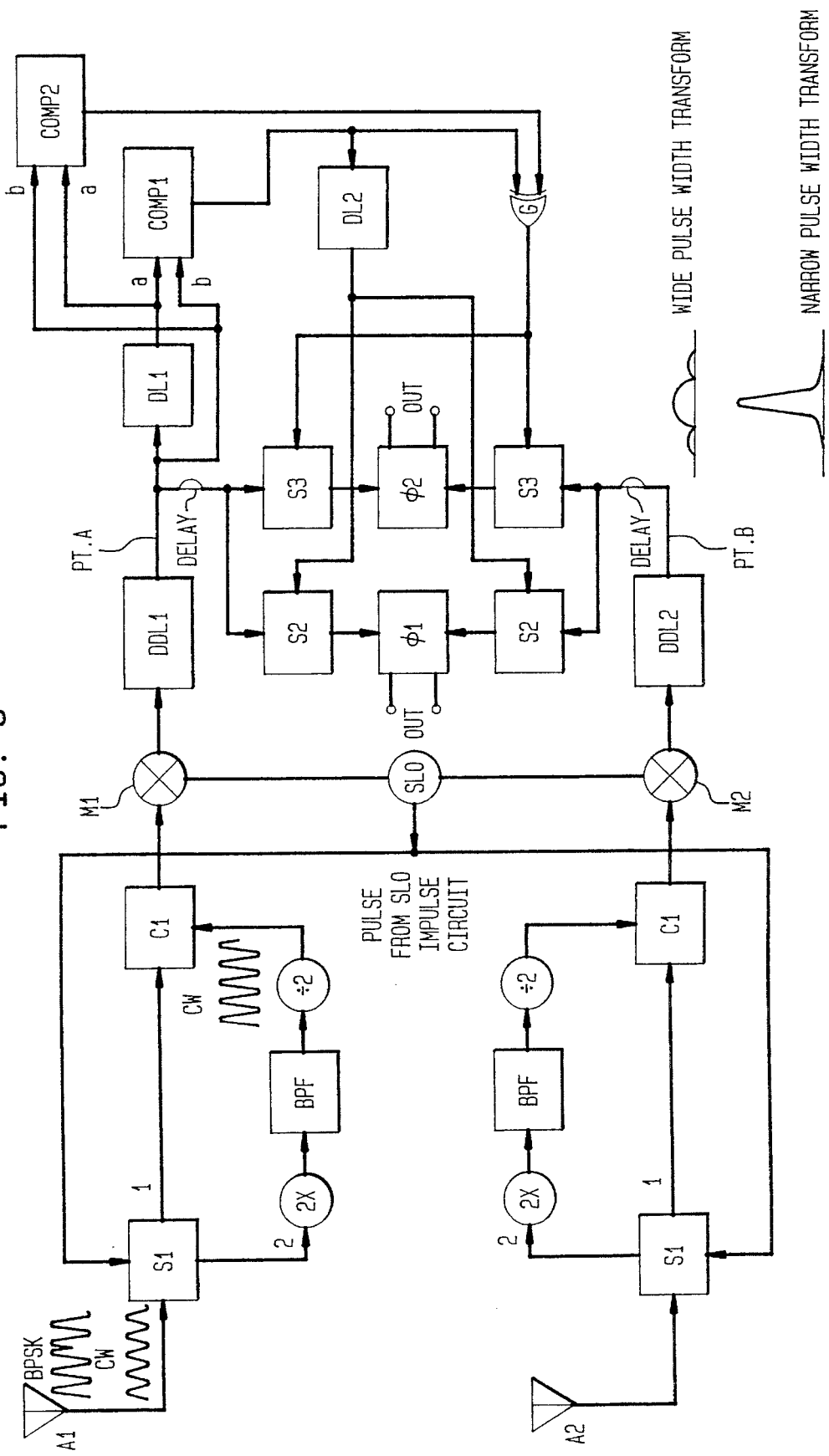
FIG. 3 is a block diagram for one preferred embodiment of the present invention.

The system for contemporaneously monitoring the phase characteristics of BPSK and CW signals in accordance with the present invention, advances the art beyond the systems disclosed in the block diagrams of FIGS. 1 and 2. As shown in FIG. 3, the present invention utilizes separate circuits for connecting physically separated antennas individually to the channels of a dual chirp-Z processor in the same manner disclosed by FIG. 2. In each such circuit, a first path passes antenna signals directly to the chirp-Z channel and a second path passes antenna signals to the chirp-Z channel through means for deriving the fundamental CW frequency of BPSK and CW signals. As previously explained in regard to FIG. 2 therefore, wide pulse width transforms appear at points "A" and "B" for BPSK signals passing through the first paths, while narrow pulse width transforms appears thereat for BPSK signals passing through the second paths, as well as for CW signals passing through either the first or second paths. The present invention includes phase detectors φ1 and φ2 which individually monitor the phase characteristics of BPSK and CW signals respectively, from transforms derived concurrently by the dual channels of the chirp-Z processor. Also included therein is circuit means for discerning whether the chirp-Z transforms derived at points "A" and "B" relate to BPSK or CW signals and passing such transforms to the appropriate phase detector in accordance with the type of signal to which they relate. Such circuitry includes signal delays DL1 and DL2, comparators COMP1 and COMP2, exclusive OR gate G and hold type switches S2 and S3, which interconnect as shown in FIG. 3. As is well known in the electrical arts, a hold switch is on only for as long as it is actuated and turns off when not activated. The level of output from COMP1 or COMP2 is either high or low depending on the relative magnitudes of the "a" and "b" inputs thereto. Output from COMP1 is high whenever the "a" input is greater than the "b" input and low whenever the "b" input is greater than or equal to the "a" input. Output from COMP2 is high whenever the "a" input is equal to or greater than the "b" input and low whenever the "b" input is greater than the "a" input. Such comparators are readily derived with integrated circuit chips having operational amplifiers which need only to be biased in accordance with the specifications provided by the chip manufacturer. Chips identified as AD9685BD/BH and AD9687BD have this capability and are available from Analog Devices, P.O. Box 280, Norwood, Mass. 02062. DL2 has a duration equal to the SLO sweep time and functions to assure that the switches S2 open to admit only narrow chirp-Z transforms relating to BPSK signals. Other components could be arranged in this circuitry to attain the results accomplished with the present invention.

This circuitry is controlled by the frequency characteristics of consecutive chirp-Z transforms at point A. When a BPSK signal is intercepted by A1 and A2, the initial chirp-Z transform is characteristically of low level and wide pulse width, while the following chirp-Z transform is characteristically of high level and narrow pulse width. Due to DL1 therefore, the "a" and "b" inputs to COMP1 and COMP2 are initially high and low levels respectively, followed by low and high levels respectively, for a BPSK signal. Such input conditions initially result in high level outputs from both COMP1 and COMP2, followed by low level outputs therefrom. These output conditions initially result in low level outputs from both DL2 and G, followed by high and low level outputs respectively, therefrom. Because of such outputs from DL2 and G, switches S3 remain closed throughout the BPSK signal, but switches S2 only remain closed initially and then open to pass the BPSK chirp-Z transforms from points A and B to phase detector φ1. When a CW signal is intercepted by A1 and A2, both the initial and following chirp-Z transforms are characteristically of high level and narrow pulse width. Due to DL1 therefore, the "a" and "b" inputs to COMP1 and COMP2 are high levels for both the initial and following CW chirp-Z transforms. Such input conditions result in low and high level outputs from COMP1 and COMP2 respectively, which in turn cause high and low level outputs from G and DL2 respectively. Because of such outputs from G and DL2, switches S2 remain closed throughout the CW signal but switches S3 open to pass the CW chirp-Z transforms from points A and B to phase detector φ2. Consequently, this circuitry discerns whether the transforms at points A and B relate to BPSK or CW signals and passes such transforms to the phase detectors so that output from φ1 only relates to BPSK signals, while output from φ2 only relates to CW signals.

Those skilled in the electronic arts will appreciate without any further explanation that within the concept of this invention, many modification and variations are possible to the above disclosed embodiments of a system for contemporaneously monitoring phase characteristics of BPSK and CW signals. Consequently, it should be understood that all such modifications and variations fall within the scope of the following claims.

What I claim is:

1. A system for contemporaneously monitoring phase characteristics of BPSK and CW signals, comprising:

a pair of physically separated antennas;

a dual channel chirp-Z processor;

individual circuits for connecting the antennas to the chirp-Z channels through first and second paths, each first path passing antenna signals directly to the chirp-Z channel and each second path passing antenna signals to the chirp-Z channel through means for deriving the fundamental CW frequency of BPSK and CW signals;

individual detectors for monitoring phase characteristics of BPSK and CW signals from transforms derived concurrently by the dual channels of the chirp-Z processor; and circuit means for discerning whether the transforms derived concurrently from the chirp-Z channels relate to BPSK or CW signals and passing such transforms to the appropriate phase detector in accordance with the type of signal to which they relate.

2. The phase monitoring system of claim 1 wherein the fundamental CW frequency deriving means in each second path is a series connection of frequency-doubling means, bandpass-filtering means, and frequency-halfing means, in that order.

3. The phase monitoring system of claim 1 wherein the discerning circuit means includes switches through which the chirp-Z transforms are passed to the phase detectors.

4. The phase monitoring system of claim 3 wherein the discerning circuit means further includes first and second comparators from which outputs are derived in response to the chirp-Z transforms being applied at the inputs thereof and such outputs are connected to control the switches.

5. The phase monitoring system of claim 4 wherein the discerning circuit means further includes an exclusive OR gate and a time delay through which the comparator outputs are connected to control the switches.

6. In a monitoring system of the type wherein phase characteristics of signals are derived from chirp-Z transforms, the improvement comprising:

circuitry for discerning between at least two type of signals to which the chirp-Z transforms relate.

7. The monitoring system of claim 6 wherein the discerning circuitry includes a comparator for each type of signal monitored, with the chirp-Z transforms being applied to the inputs of each comparator and the outputs from the comparators being applied to means for determining the type of signal to which the chirp-Z transforms relate.

* * * * *